United States Patent
Matyac et al.

(10) Patent No.: US 12,270,840 B2
(45) Date of Patent: Apr. 8, 2025

(54) TRANSFER SWITCH WITH COMMUNICATION CAPABILITY

(71) Applicant: North American Power Products, Inc., Lawrenceville, GA (US)

(72) Inventors: Mark Matyac, Lawrenceville, GA (US); Adithya Shetty, Lawrenceville, GA (US)

(73) Assignee: NORTH AMERICAN POWER PRODUCTS, INC., Lawrenceville, GA (US)

( * ) Notice: Subject to any disclaimer, the term of this patent is extended or adjusted under 35 U.S.C. 154(b) by 276 days.

(21) Appl. No.: 17/752,501

(22) Filed: May 24, 2022

(65) Prior Publication Data

US 2022/0349926 A1 Nov. 3, 2022

Related U.S. Application Data

(63) Continuation-in-part of application No. 17/319,544, filed on May 13, 2021, now Pat. No. 11,929,637,
(Continued)

(51) Int. Cl.
*G01R 22/06* (2006.01)
*G01R 1/04* (2006.01)
(Continued)

(52) U.S. Cl.
CPC ......... *G01R 22/061* (2013.01); *G01R 1/0416* (2013.01); *H01H 71/1009* (2013.01); *H02B 1/04* (2013.01)

(58) Field of Classification Search
CPC ............... G01R 22/061; G01R 1/0416; H01H 71/1009; H02B 1/04
See application file for complete search history.

(56) References Cited

U.S. PATENT DOCUMENTS

| | | | |
|---|---|---|---|
| 5,027,051 | A | 6/1991 | Lafferty |
| 5,045,969 | A | 9/1991 | Menasco |

(Continued)

FOREIGN PATENT DOCUMENTS

| | | |
|---|---|---|
| EP | 1 890 164 A2 | 2/2008 |
| EP | 1 962 098 A1 | 8/2008 |
| WO | 210/048993 A1 | 5/2010 |

OTHER PUBLICATIONS

Maehlum, Mathias Aarre: "Grid-Tied, Off-Grid and Hybrid Solar Systems", Aug. 14, 2013, Energy Informative (downloaded from http://energyinformative.org/grid-tied-off-grid-and-hybrid-solar-systems/).

(Continued)

*Primary Examiner* — Jared Fureman
*Assistant Examiner* — Duc M Pham
(74) *Attorney, Agent, or Firm* — Bryan W. Bockhop; Bockhop Intellectual Property Law, LLC

(57) ABSTRACT

An apparatus for selectively coupling a load to a grid power source and an inverter that is fed electric power by an alternate power source includes a first node coupled to the load. A grid sensor senses a state of the grid power source. A grid relay couples the grid power source to the first node when in a closed state and decouples the grid power source from the first node when in an open state. An inverter relay couples the inverter to the first node when in a closed state and decouples the inverter from the first node when in an open state. A controller is programmed to: cause the grid relay and the inverter relay to closed when the grid sensor indicates available grid power and cause the grid relay to open when grid power is not available. A communications circuit senses a current state of the controller and wirelessly communicates a change of state of a selected one of the grid sensor and the controller to a remote device.

19 Claims, 14 Drawing Sheets

Related U.S. Application Data which is a continuation-in-part of application No. 16/599,826, filed on Oct. 11, 2019, now Pat. No. 11,031,782, which is a continuation-in-part of application No. 15/825,644, filed on Nov. 29, 2017, now Pat. No. 10,498,166.

(60) Provisional application No. 62/741,903, filed on Oct. 5, 2018.

(51) Int. Cl.
*H01H 71/10* (2006.01)
*H02B 1/04* (2006.01)

(56) References Cited

U.S. PATENT DOCUMENTS

| | | | |
|---|---|---|---|
| 5,270,636 | A | 12/1993 | Lafferty |
| 6,188,145 | B1 | 2/2001 | Stewart |
| 6,914,418 | B2 | 7/2005 | Sung |
| 7,843,085 | B2 | 11/2010 | Ledenev et al. |
| 7,929,327 | B2 | 4/2011 | Haines et al. |
| 9,711,967 | B1* | 7/2017 | Czarnecki ................ H02J 5/00 |
| 2005/0077879 | A1 | 4/2005 | Near |
| 2006/0190140 | A1 | 8/2006 | Soni |
| 2006/0232433 | A1 | 10/2006 | Holle et al. |
| 2009/0152947 | A1 | 6/2009 | Wang |
| 2010/0225167 | A1 | 9/2010 | Stair et al. |
| 2011/0115295 | A1 | 5/2011 | Moon et al. |
| 2011/0133558 | A1 | 6/2011 | Park |
| 2011/0148205 | A1 | 6/2011 | Moon |
| 2011/0148360 | A1 | 6/2011 | Lee |
| 2011/0175453 | A1* | 7/2011 | Batzler ................ H02J 9/06 307/68 |
| 2012/0044014 | A1 | 2/2012 | Stratakos et al. |
| 2012/0098350 | A1 | 4/2012 | Campanella et al. |
| 2014/0084687 | A1 | 3/2014 | Dent |
| 2015/0316944 | A1* | 11/2015 | Thellend ................ G05B 15/02 700/292 |
| 2016/0164295 | A1 | 6/2016 | Cheng et al. |
| 2017/0047742 | A1* | 2/2017 | Narla ................ H02J 3/381 |
| 2017/0264212 | A1 | 9/2017 | Muguerza Olcoz et al. |
| 2017/0317501 | A1 | 11/2017 | Moriyama |
| 2019/0081458 | A1 | 3/2019 | Lapushner et al. |
| 2019/0181659 | A1 | 6/2019 | Kim |

OTHER PUBLICATIONS

WIPO: "Notification of Transmittal of the International Search Report and the Written Opinion of the International Searching Authority, or the Declaration"; PCT Feb. 8, 2019 (related PCT case).

WIPO: "Notification of Transmittal of the International Search Report and the Written Opinion of the International Searching Authority, or the Declaration"; Aug. 1, 2023 (Search report in related PCT case No. PCT/US23/22998).

* cited by examiner

TRANSFER SWITCH WITH COMMUNICATION CAPABILITY

CROSS-REFERENCE TO RELATED APPLICATION(S)

This application is a continuation-in-part of U.S. Ser. No. 17/319,544, filed on May 13, 2021, which is a continuation-in-part of U.S. Ser. No. 16/599,826, filed on Oct. 11, 2019, and now issued as U.S. Pat. No. 11,031,782, which is a continuation-in-part of U.S. Ser. No. 15/825,644, filed on Nov. 29, 2017 and now issued as U.S. Pat. No. 10,498,166; Ser. No. 16/599,826 also claims priority on U.S. Provisional Ser. No. 62/741,903 filed on Oct. 5, 2018; the entirety of each of which is hereby incorporated herein by reference.

BACKGROUND OF THE INVENTION

1. Field of the Invention

The present invention relates to electric power systems and, more specifically, to a device that controls an electric power system.

2. Description of the Related Art

As shown in FIG. 1A, a typical existing meter base 10, used for electrically coupling power from a two-phase power source (e.g., a first 120V AC "A-" phase and a second 120V AC "B-" phase that is out of phase with the first 120V AC phase) to a load (such as an electrical distribution system in a building) typically includes four sockets 14. A first socket 14 is coupled to the A-phase S120A wire from the source (which can be from the power grid or from an alternate source) and a second socket 14 is coupled to the B-phase S120B wire from the source. A neutral hub N is coupled to the neutral wire from the source (which, in some embodiments, is coupled to a ground). A third socket 14 is coupled to the A-phase L120A wire to the load and a fourth socket 14 is coupled to the B-phase L120B wire to the load. Typically, the wires to the load go through a knock-out hole 12 that is in communication with a hole in an exterior wall of a building. The wires from the source are contained in a conduit 19 coming from the source.

As shown in FIG. 1B, a typical existing electricity meter includes four plugs 16 that are complimentary in shape to the sockets 14 and that couple the above-described wires to an electricity meter, which measures consumption of electricity flowing from the source through the load. The meter includes an electrical measuring and display unit 18 (see FIG. 3A) for measuring electrical consumption, which is typically covered with a clear plastic protector 21.

With increased use of electronic devices there comes an increased risk of damage to such devices as a result of electrical surges (e.g., from lightning and power transients). To remedy this, some users plug all of their electronic devices into local surge suppressors. However, local surge suppressors can be bulky and seen as unsightly. Some users install surge suppressors into the breaker panels in their buildings. However, such installations can be time consuming, especially for multi-panel buildings such as office buildings and apartment complexes.

Powered electrical distribution systems can give rise to hazards during certain situations, such as when firefighters have to spray water into burning buildings—in which wires may be exposed—while fighting fires. In such emergency situations, finding a disconnect switch for an entire electrical distribution system can be difficult for emergency personnel. This can be especially problematic when the load distribution system can be powered by both a utility grid power source and an alternate power source.

Multi-source electric power systems can draw power, for example, either from a power grid or an alternative power source (e.g., a solar power system, a wind power system, a hydroelectric power system, a power generator, etc.). Automatic switching from one power source to another power source can occur under certain conditions. For example, a homeowner might want power supplied to a house from a solar power source whenever it is sunny, but might want the power source be switched to grid power at night and whenever it is cloudy. Similarly, if grid power is down, then the homeowner might want the power sourced from a local generator, but then switched back to grid power when it is available. On some occasions, the homeowner might not be available to check on the status of the home's power distribution system or to make changes to its configuration.

There is also a need for a device that provides a mechanism for receiving status information and remotely controlling a power distribution system.

There is also a need for a device that quickly changes the configuration of a power distribution system.

SUMMARY OF THE INVENTION

The disadvantages of the prior art are overcome by the present invention which, in one aspect, is an intermediate disconnect section for mounting on a meter base having a source connector and a load connector. The intermediate section is adapted for mounting of an electricity meter having a source connection couplable to the source connector and a load connection couplable to the load connector. The intermediate section includes a platform. A first source coupling is mounted on the platform and is adapted to be electrically coupled to the source connector of the meter base. A second source coupling is mounted on the platform and is adapted to be electrically coupled to the source connection of the electricity meter. A first load coupling is mounted on the platform and is adapted to be electrically coupled to the load connector of the meter base. A second load coupling is mounted on the platform and is adapted to be electrically coupled to the load connection of the electricity meter and electrically coupled to the first load coupling. A switch is mounted on the platform and is adapted selectively to couple and decouple the first source coupling to and from the second source coupling. A switching mechanism is configured to open and close the switch. The switching mechanism includes a device that is external to the platform that allows a user to open and close the switch manually.

In another aspect, the invention is an intermediate section for mounting on a meter base having a source connector. The source connector includes a neutral coupling, and a load connector. The intermediate section is adapted for mounting of an electricity meter having a source connection couplable to the source connector and a load connection couplable to the load connector. The intermediate section includes a platform. A first source coupling is mounted on the platform and is adapted to be electrically coupled to the source connector of the meter base. A second source coupling is mounted on the platform and is adapted to be electrically coupled to the source connection of the electricity meter. A first load coupling is mounted on the platform and is adapted to be electrically coupled to the load connector of the meter base. A second load coupling is mounted on the platform and is adapted to be electrically coupled to the load connection of the electricity meter and electrically coupled to the first load coupling. A surge suppressor is mounted on the platform and is electrically coupled to a neutral coupling and to the first load coupling.

In another aspect, the invention is an electricity meter system that includes a meter base having a source connector electrically coupled to a power source and a load connector electrically coupled to a load and an electricity meter having a source connection couplable to the source connector and a load connection couplable to the load connector. An intermediate disconnect section includes: a platform; a first source coupling mounted on the platform and adapted to be electrically coupled to the source connector of the meter base; a second source coupling mounted on the platform and adapted to be electrically coupled to the source connection of the electricity meter; a first load coupling mounted on the platform and adapted to be electrically coupled to the load connector of the meter base; a second load coupling mounted on the platform and adapted to be electrically coupled to the load connection of the electricity meter and electrically coupled to the first load coupling; a switch mounted on the platform and adapted to couple and decouple the first source coupling to and from the second source coupling; and a switching mechanism that is configured to open and close the switch and that includes a device that is external to the platform that allows a user to open and close the switch manually.

In another aspect, the invention is an intermediate disconnect section mountable on a meter base having a source connector coupled to a load. The intermediate disconnect section is configured to receive a meter and is for use with a utility power source and an alternate power source. The intermediate disconnect section includes a utility power breaker having a closed state in which the utility power source is coupled to the source connector of the meter base through the meter and an open state in which the utility power source decoupled from the source connector of the meter base. An alternate power breaker has a closed state in which the alternate power source is coupled to the source connector of the meter base. A switching mechanism selectively opens and closes the utility power breaker and selectively opens and closes the alternate power breaker, so as to be in exactly one of a first state, a second state or a third state. The utility power breaker is closed and the alternate power breaker is open while in the first state. The utility power breaker is open and the alternate power breaker is closed while in the second state. The utility power breaker is open and the alternate power breaker is open while in the third state.

In another aspect, the invention is an intermediate disconnect section mountable on a meter base having a source connector coupled to a load. The intermediate disconnect section is configured to receive a meter and is configured for use with a utility power source and an alternate power source. The intermediate disconnect section includes a utility power breaker having a closed state in which the utility power source is coupled to the source connector of the meter base through the meter and an open state in which the utility power source decoupled from the source connector of the meter base. An alternate power breaker has a closed state in which the alternate power source is coupled to the source connector of the meter base. A switching mechanism selectively opens and closes the utility power breaker and selectively opens and closes the alternate power breaker, so as to be in exactly one of a first state, a second state or a third state. The utility power breaker is closed and the alternate power breaker is open while in the first state. The utility power breaker is open and the alternate power breaker is closed while in the second state. The utility power breaker is open and the alternate power breaker is open while in the third state. A frame supports the utility power breaker, the alternate power breaker, the rack and the pinion. A rod extends from the switching mechanism and supports a lever. A locking device secures the lever when the locking mechanism is in the third state. The lever has an elongated portion that defines a lever opening having an opening width and running along a length of the elongated portion so as to be bounded by two oppositely-disposed walls. Each of the two oppositely-disposed walls defines a hole passing therethrough in which the holes are aligned with each other. The locking device includes a key hingedly attached to the frame. The key has an end portion that has a key width that is narrower than the opening width. The key is positioned so that the end portion is rotatable so as to extend outwardly through the lever opening when the lever is in the off position. A pin passes through the holes so as to keep the key extended outwardly through the lever opening, thereby preventing the lever from exiting the off position.

In another aspect, the invention is an intermediate disconnect section mountable on a meter base having a source connector coupled to a load. The intermediate disconnect section is configured to receive a meter and is for use with a utility power source and an alternate power source. The intermediate disconnect section includes a utility power breaker having a closed state in which the utility power source is coupled to the source connector of the meter base through the meter and an open state in which the utility power source decoupled from the source connector of the meter base. An alternate power breaker has a closed state in which the alternate power source is coupled to the source connector of the meter base. A switching mechanism selectively opens and closes the utility power breaker and selectively opens and closes the alternate power breaker, so as to be in exactly one of a first state, a second state or a third state. The utility power breaker is closed and the alternate power breaker is open while in the first state. The utility power breaker is open and the alternate power breaker is closed while in the second state. The utility power breaker is open and the alternate power breaker is open while in the third state. The switching mechanism includes a rack that is coupled to both the utility power breaker and the alternate power breaker. The rack having a first position in which the switching mechanism is in the first state, a second position in which the switching mechanism is in the second state, and a third position in which the switching mechanism is in the third state. A pinion is engaged with the rack. The pinion causes the rack to move to one of the first position, the second position and the third position. A lever is coupled to the pinon and causes the pinon to rotate in response to a force applied thereto. The lever has a utility position that places the rack in the first position, an alternate source position that places the rack in the second position, and an off position that places the rack in the third position.

In yet another aspect, the invention is an apparatus for selectively coupling a load to a grid power source and an inverter that is fed electric power by an alternate power source. A first node is coupled to the load. A grid sensor senses a state of the grid power source. A grid relay couples the grid power source to the first node when in a closed state and decouples the grid power source from the first node when in an open state. An inverter relay couples the inverter to the first node when in a closed state and decouples the inverter from the first node when in an open state. A controller is responsive to the grid sensor and is programmed to: cause the grid relay to be in the closed state and cause the inverter relay to be in the closed state when the grid sensor indicates power is available from the grid and cause the grid relay to be in the open state when the grid sensor indicates that power is not available from the grid. A communications circuit senses a current state of the controller and wirelessly communicates a change of state of a selected one of the grid sensor and the controller to a remote device.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
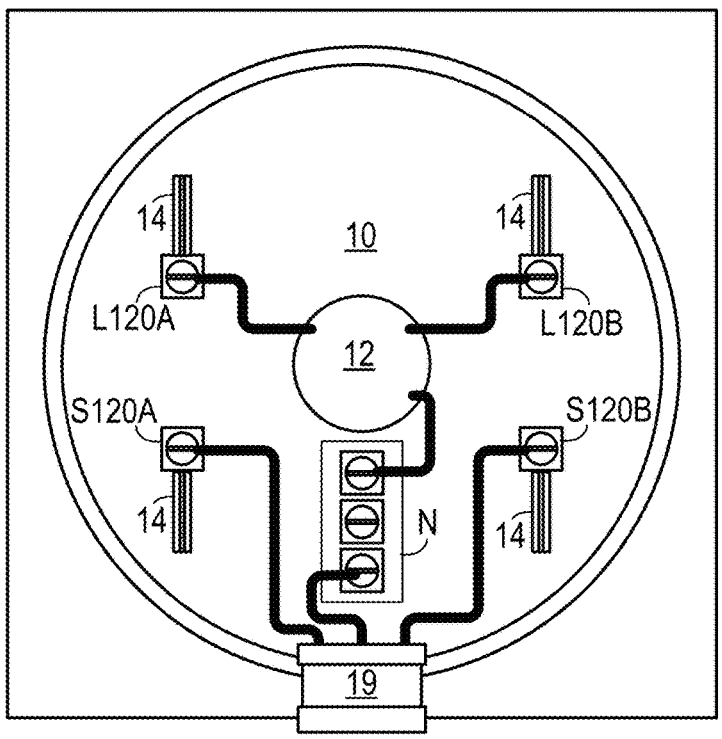
FIG. 1A is a schematic diagram of a prior art meter base wired to receive power from a power source and to provide power to a load.
Figure 1B:
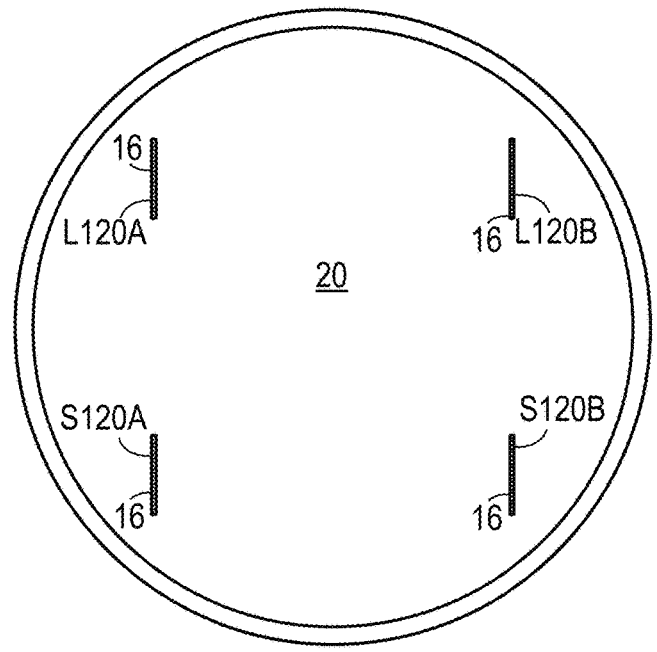
FIG. 1B is a schematic diagram of a bottom of a prior art electric meter of a type that is configured to be plugged into a meter base of the type shown in FIG. 1A.
Figure 2A:
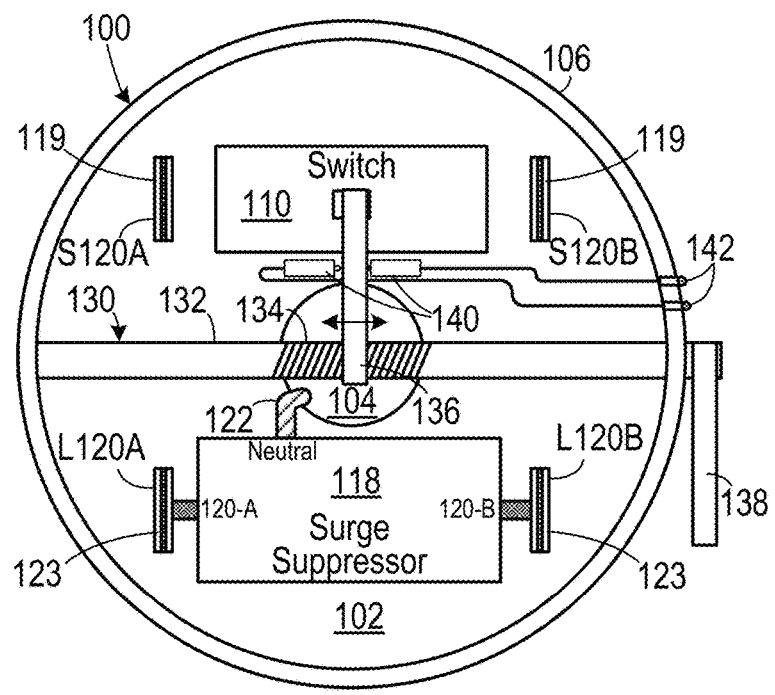
FIG. 2A is a schematic diagram of a top side plan view of one embodiment of an intermediate section that is configured to be coupled to electric meters, such as the type shown in FIG. 1B.
Figure 2B:
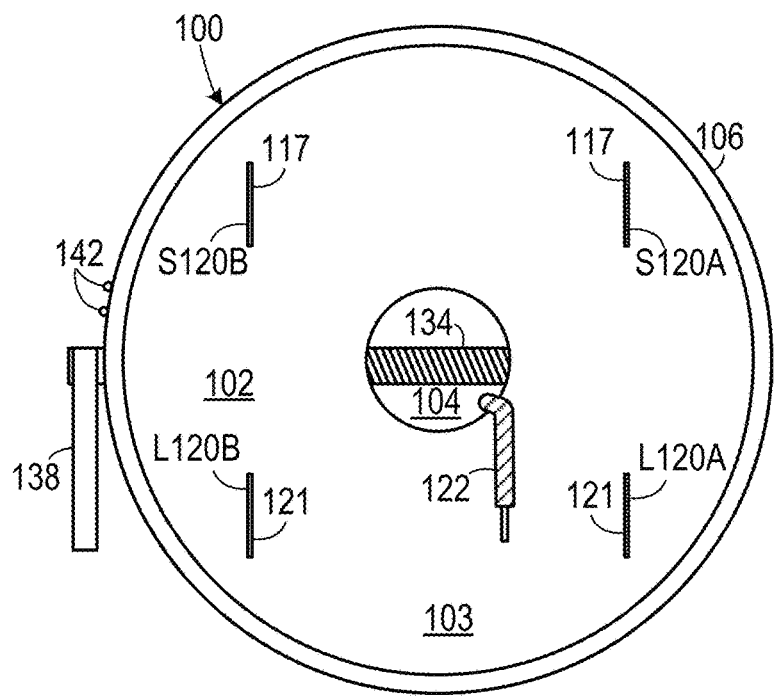
FIG. 2B is a schematic diagram of a bottom side plan view of the intermediate section shown in FIG. 2A that is configured to be plugged into a meter base of the type shown in FIG. 1A.
Figure 2C:
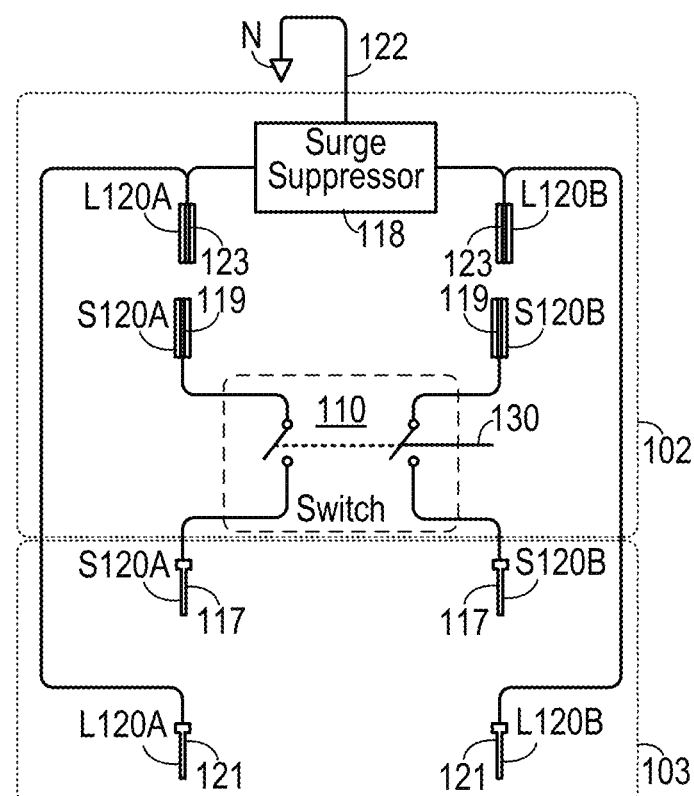
FIG. 2C is a wiring diagram of the intermediate section shown in FIGS. 2A and 2B.

A preferred embodiment of the invention is now described in detail. Referring to the drawings, like numbers indicate like parts throughout the views. Unless otherwise specifically indicated in the disclosure that follows, the drawings are not necessarily drawn to scale. The present disclosure should in no way be limited to the exemplary implementations and techniques illustrated in the drawings and described below. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIGS. 2A-2C and FIGS. 3A and 3B, one embodiment of a socket based disconnect with surge protection includes an intermediate section 100 for installation between a meter base 10 (which may be affixed to an exterior wall 2) and an electricity meter 20. The intermediate section includes a platform 106 that is shaped so as to fit both the meter base 10 and the electricity meter 20, and is typically made from a non-conductive material, such as a plastic. Electrically, the intermediate section 100 includes a bottom side 103 with load plugs 121 (L120A and L120B) that can be plugged into the load sockets 14 of the meter base 10 and source plugs 117 (S120A and S120B) that can be plugged into the source sockets 14 of the meter base 10 (see, FIGS. 3A-3B). The top side 102 includes load sockets 123 (electrically L120A and L120B) and source sockets 119 (electrically S120A and S120B) into which load plugs 16 and source plugs 16 of the electricity meter 20 can be plugged (see, FIGS. 3A-3B). The load sockets 123 (L120A and L120B) on the top side 102 are electrically coupled to the load plugs 121 (electrically L120A and L120B) on the bottom side 103.

In terms of the physical coupling components, a first source coupling 117, including two plugs—each corresponding to a different phase (A and B) from the power source, is mounted on the bottom side 103 of the platform 106. A second source coupling 119, including two sockets, is mounted on the top side 102 of the platform 106 and is selectively coupled to the source connection of the electricity meter 20. The first source coupling 117 is selectively couplable to the second source coupling 119 via the switch 110. A first load coupling 121 is mounted on the bottom side 103 of the platform 106 and is electrically couplable the load connectors of the meter base 10. A second load coupling 123 is mounted on the top side 102 of the platform 106 and is electrically couplable to the load connection of the electricity meter 120 and is electrically coupled to the first load coupling 121.

The intermediate section 100 includes a switch 110 that is configured to couple (and decouple) the source sockets S120A and S120B on the top side 102 to (and from) the source plugs S120A and S120B on the bottom side 103 selectively. A manual mechanism 130 that includes an external handle 138 is used to open and close the switch 110. Thus, the intermediate section 100 provides a way to disconnect the load from the source by flipping the handle 138. This can provide first responders (such as firefighters) and utility workers to disconnect the wiring system of a building (i.e., the load) from the grid power supply (i.e., the source) or other power source quickly from the outside of the building. (In alternate embodiments, the switch 110 can be configured to connect and disconnect load sockets L120A and L120B on the top side 102 to (and from) the load plugs L120A and L120B on the bottom side 103.)

A surge suppressor 118 (also referred to as a "surge protector") is coupled to the load plugs L120A and L120B and a neutral wire 122 that is to be coupled to the neutral N of both the source and the load through a hole 104. The surge suppressor 118 is configured to provide surge protection to both phases of the load, irrespective of whether the source power is coupled to the load. (In alternate embodiments, the surge suppressor 118 can be coupled to the source plugs S120A and S120B instead of to the load.) In one embodiment, the surge suppressor 118 can include at least one metal oxide varistor (MOV).

In one embedment, the switch control mechanism 130 includes a rod 132 with a threaded portion 134 that engages a complimentarily-threaded lateral movement member 136 that imposes lateral motion onto the switch 110 so as to open it or close it when the rod 132 is rotated. A handle 138 is affixed to the rod 132, which allows one to rotate the rod 132, thereby moving the movement member 136 so that when the handle 138 is in a first position, the switch 110 is open and the source is isolated from the load. When the handle 138 has been rotated to a second position that is different from the first position, the switch 110 is closed and current can flow through the meter 20 to the load.

Figure 3A:
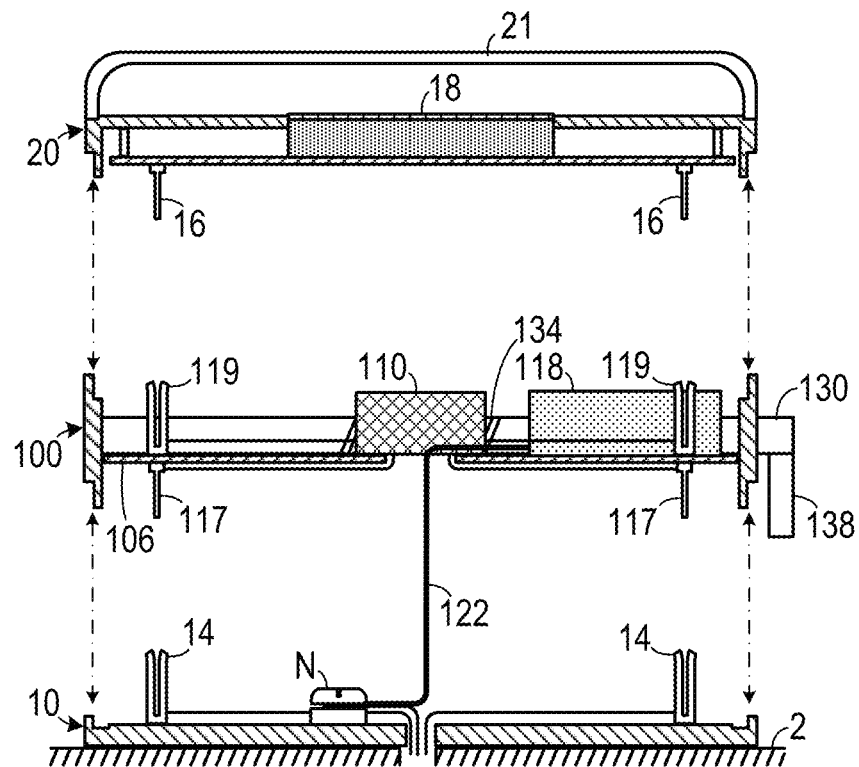
FIG. 3A is a side exploded view schematic diagram of a meter base, an intermediate section and an electric meter.
Figure 3B:
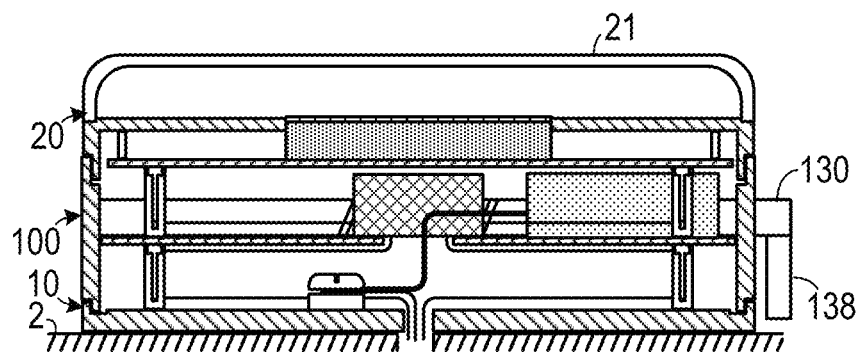
FIG. 3B is a side elevational view schematic diagram of the meter base, the intermediate section and the electric meter shown in FIG. 3A after installation.
Figure 4:
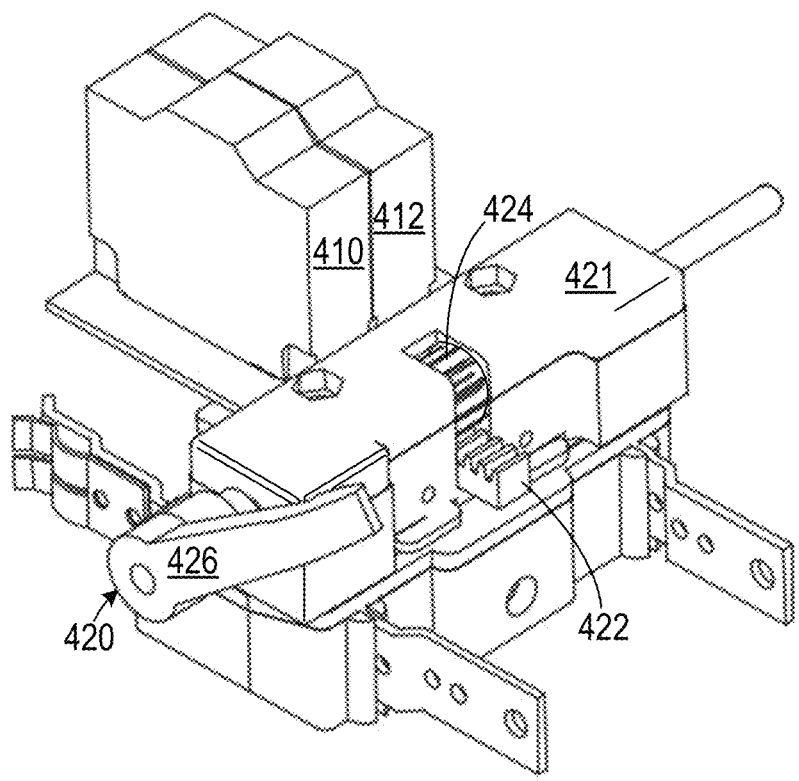
FIG. 4 is a perspective view of alternating disconnect system.

As can be seen in FIG. 3A, prior to installing the intermediate section 100, the neutral wire 122 is coupled to the neutral N lead for the system at the hub on the meter base 10. Then, as shown in FIG. 3B, the intermediate section 100 is plugged into the meter base 10 and the meter 20 is plugged into the intermediate section 100. Retaining rings (not shown) can then be installed to prevent unplugging of the meter 20 and the intermediate section 100 so as to prevent tampering and hazards. The platform 106 can be made of plastic and has a shape that is complementary to both the meter base 10 and the electricity meter 20 so as to be able to fit tightly between the two.

The invention has the advantage of allowing both a power disconnect and a surge suppressor to be installed quickly, simply by unplugging a meter from a meter base, plugging in an intermediate section into the meter base and plugging the meter into the intermediate section. Also, it is easy for electricians and emergency personnel to find the disconnect, because it is at the location of the meter.

Figure 5A:
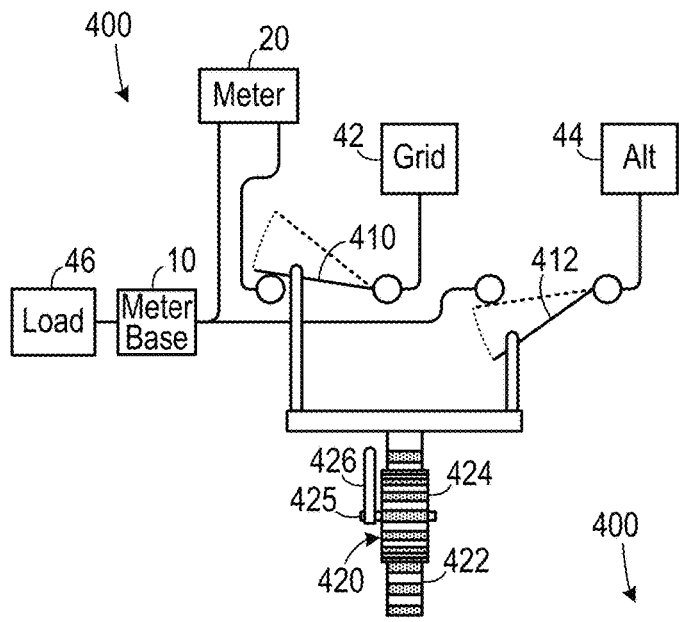
FIGS. 5A-5C are schematic diagrams of the alternating disconnect system in different states.
Figure 5B:
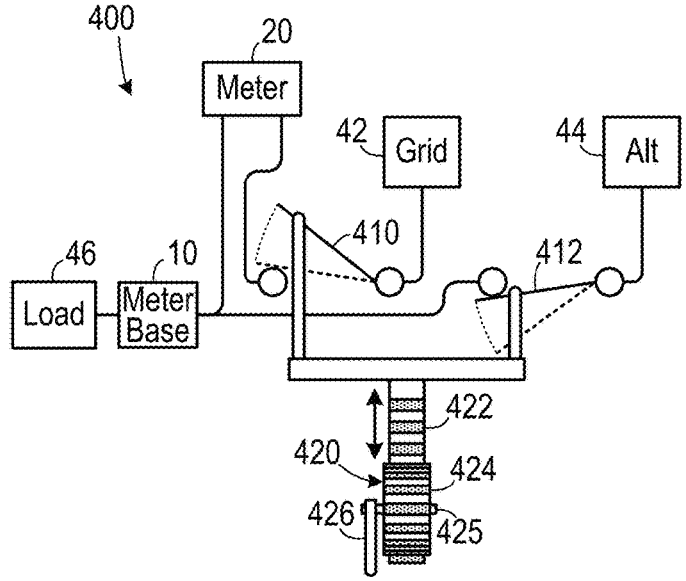
Figure 5C:
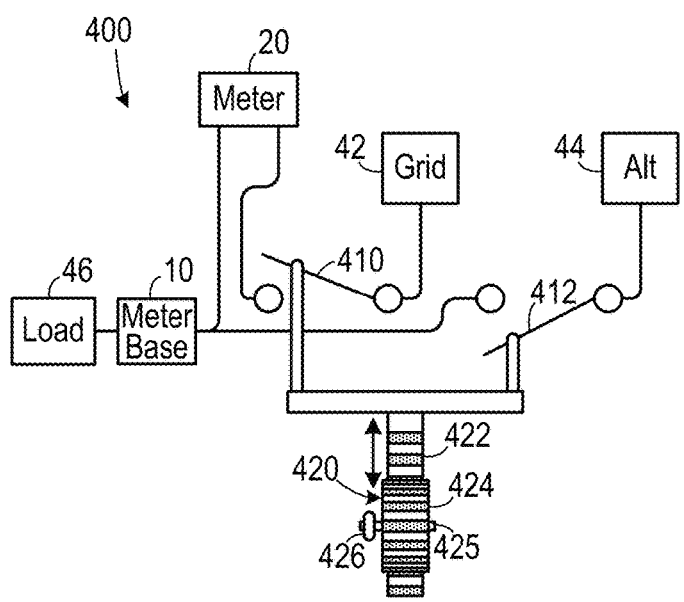

In one embodiment, as shown in FIGS. 4, 5A-5C, the intermediate section can include an alternating disconnect system 400 that selectively couples the load 46 exclusively to only one of the main power source 42 (e.g., the power grid), the alternate power source 44 (e.g., a solar or wind power source), or to neither source. The alternating disconnect system 400 includes a main utility power breaker 410 and an alternate power breaker 412, the states of both of which are controlled by a rack and pinion system 420. The rack and pinion system 420 includes a rack 422 that is mechanically coupled to the main utility power breaker 410 and the alternate power breaker 412. The rack 422 is enmeshed with a pinion gear 424 that is coupled to a handle 426 that is supported by a frame 421. Rotation of the handle 426 causes the rack 422 to move forward and backward. The rack 422 is mechanically coupled to the main power breaker 410 and the alternate power breaker 412 in such a way that when the main utility power breaker 410 is open, the alternate power breaker 412 is closed and when the main power breaker 410 is closed, the alternate power breaker 412 is open. Thus, when the rack 422 is pushed forward by the gear 424, the main power source 42 is disconnected from the load 46 and the alternate power source 44 is connected to the load 46; when the rack 422 is pulled backward by the gear 424, the main power source 42 is connected to the load 46 through the meter 20 and the alternate power source 44 is disconnected from the load 46. As shown in FIG. 5C, both the main power breaker 410 and the alternate power breaker 412 can have a central open position and the rack 422 can be positioned so that both are in the open position, thereby decoupling both the main power source 42 and alternate power source 44 from the load 46.

Figure 6A:
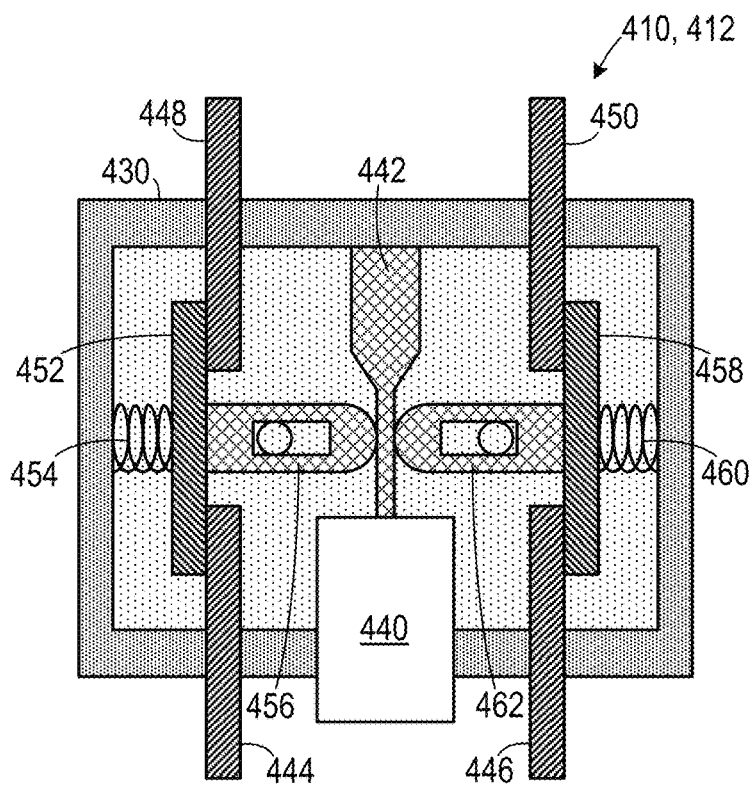
FIGS. 6A-6B are schematic diagrams of a grid relay switch in two different states.
Figure 6B:
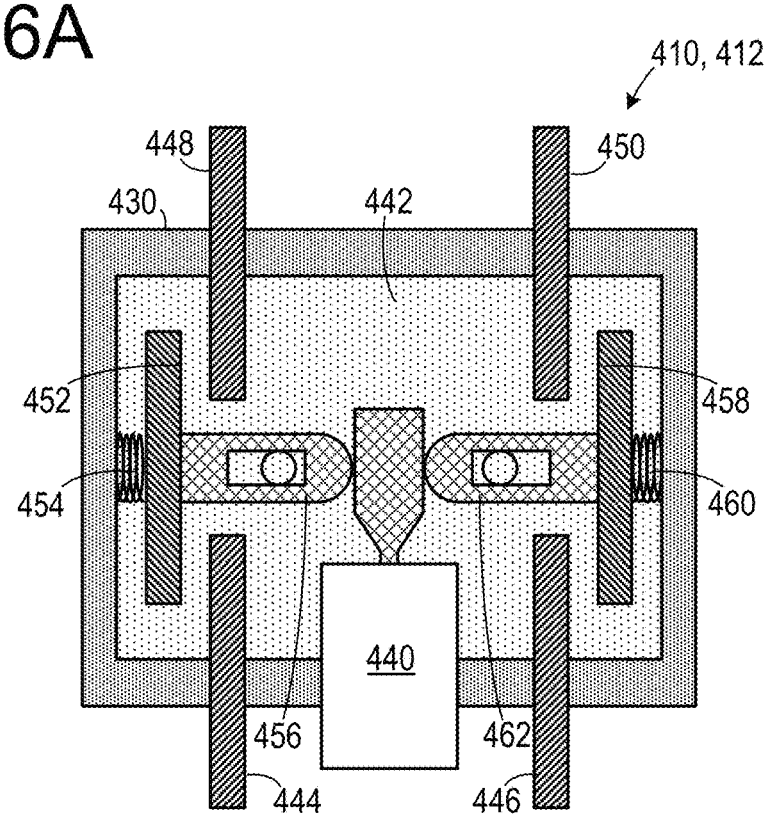
Figure 7A:
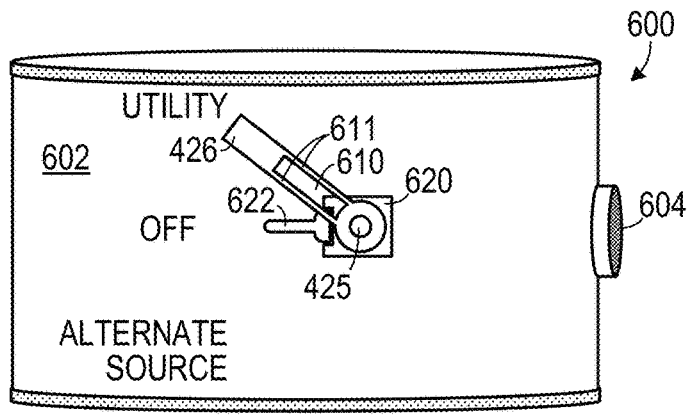
FIGS. 7A-7C are elevational views of an intermediate disconnect section in different states.
Figure 7D:
FIG. 7D is a perspective view of an intermediate disconnect section.
Figure 7B:
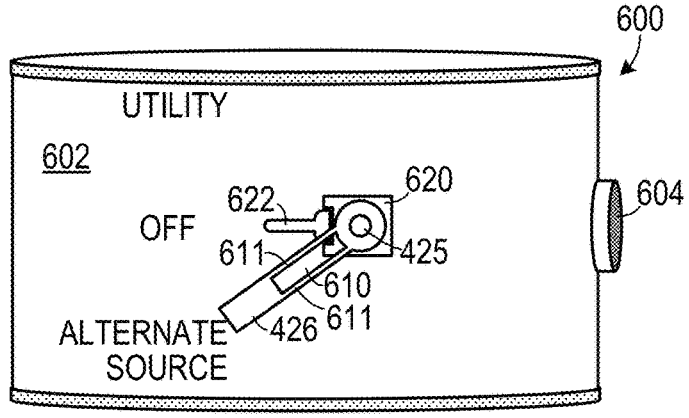

As shown in FIGS. 6A-6B, one embodiment of a power breaker 410, 412 used to couple the grid power to the load through the meter includes a housing 430, which in one embodiment includes an injection-molded plastic. A first base contact 444 and a second base contact 446 are held in a fixed relationship with the housing 430. Similarly, a first meter contact 448 and a second meter contact 450 are held in a fixed relationship with the housing. A first moving contact 452 is in a movable relationship with the housing 430 and is movable between contacting both the first base contact 444 and the first meter contact 448, thereby selectively electrically coupling the first base contact 444 to the first meter contact 448. A first spring 454 pushes the first moving contact 452 toward the first base contact 444 and the first meter contact 448. A first arm 456 is in sliding relationship along a first direction relative to the housing 430 and is coupled to the first moving contact 452. Similarly, a second moving contact 458 is in a movable relationship with the housing and movable between contacting both the second base contact 446 and the second meter contact 450, thereby selectively electrically coupling the second base contact 446 to the second load contact 450. A second spring 460 pushes the second moving contact 458 toward the second base contact 446 and the second meter contact 450. A second arm 462 is in sliding relationship along a second direction relative to the housing 430 and is coupled to the second moving contact 458.

A plunger 442 has a first position (as shown in FIG. 6A) which allows the first spring 454 to push the first moving contact 452 into a closed position that electrically couples first base contact 444 to the first meter contact 448 and that allows the second spring 460 to push the second moving contact 458 into a closed position that electrically couples second base 446 contact to the second meter contact 450. The plunger 442 also has a second position (as shown in FIG. 6B) which pushes the first arm 456 and the first moving contact 452 into an open position that electrically decouples first base contact 444 from the first meter contact 448 and that pushes the second arm 462 and the second moving contact 458 into an open position that electrically decouples second base contact 446 from the second meter contact 450. A driving mechanism 440 (which, in certain embodiments can include a rack and pinion system 420 of the type shown in FIGS. 4 and 5A-5C), selectively moves the plunger 442 between the first position and the second position.

As shown in FIGS. 7A-7D, one embodiment of an intermediate disconnect section 600 includes a utility power breaker and an alternate source power breaker (of the type shown in FIGS. 4 and 5A-5C) supported in a frame 602. The rod 425 from the pinion device 424 extends through the frame 602 and supports a lever 426, which a user moves to change the states of the power breakers. The lever 426 has three positions including: a "utility" position, which puts the power breakers in a state in which the load is connected to the utility power source; an "alternate source" position, which puts the power breakers in a state in which the load is connected to the alternate power source (such as, e.g., a solar power source, a wind generator power source or a local generator power source); and an "off" position, which disconnects the load from both power sources.

Figure 8A:
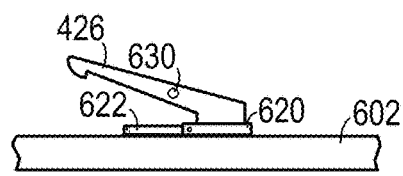
FIGS. 8A-8B are details of a locking device.
Figure 8B:
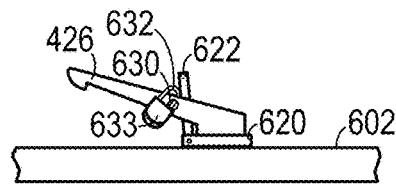

A locking device is used to secure the lever 426 it is in the off position. This would typically be used when electrical work is being conducted on the load or during emergency situations where emergency workers (e.g., firefighters) might come into contact with the load wiring. In one embodiment, as shown in FIGS. 7A-7B and 8A-8B, the locking device includes a key base 620 that is attached to the frame 602 and that has an end portion 622 hingedly attached to the key base 620. The end portion 622 can move from a down position (as shown in FIG. 8A) to an upward position (as shown in FIG. 8B). In this embodiment, the lever 426 defines a lever opening 610 that is bounded by two oppositely-disposed walls 611.

Figure 7C:
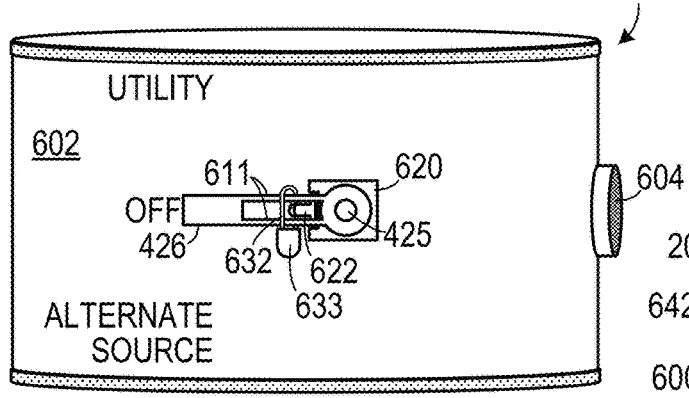

The end portion 622 has a key width that is narrower than the width of the opening 610 so that when the lever 426 is in the off position (as shown in FIG. 7C), the end portion 622 is rotatable so as to extend outwardly through the lever opening 610. Each of the two oppositely-disposed walls 611 defines a hole 630 passing therethrough and the holes 630 are aligned with each other. A locking pin 632 can be passed through the holes 630 thereby keeping the key end portion 622 extended through the lever opening 610, which prevents the lever 426 from exiting the off position. An indictor tab 633 can be used to secure the pin 632 and indicate that the lever 426 is secured in the off position.

Figure 9:
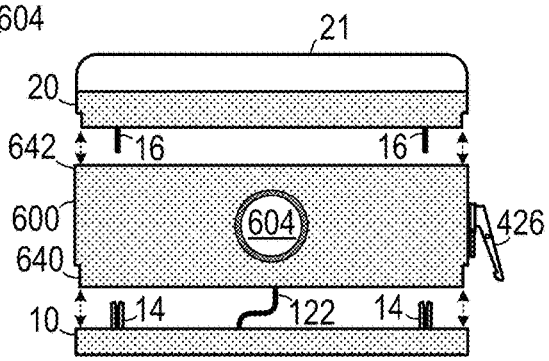
FIG. 9 is an exploded view of a meter base, and intermediate disconnect section and a meter.

As shown in FIG. 9, the frame 602 can include a cylindrical casing (typically made of a suitable plastic) with an alternate power source port 604 for connecting a cable from the alternate power source. The cylindrical casing includes a first end shape 640 that is complementary to a mating surface of the meter base 10 and a second end shape 642 that is complementary to a mating surface of the electricity meter 20.

Figure 10:
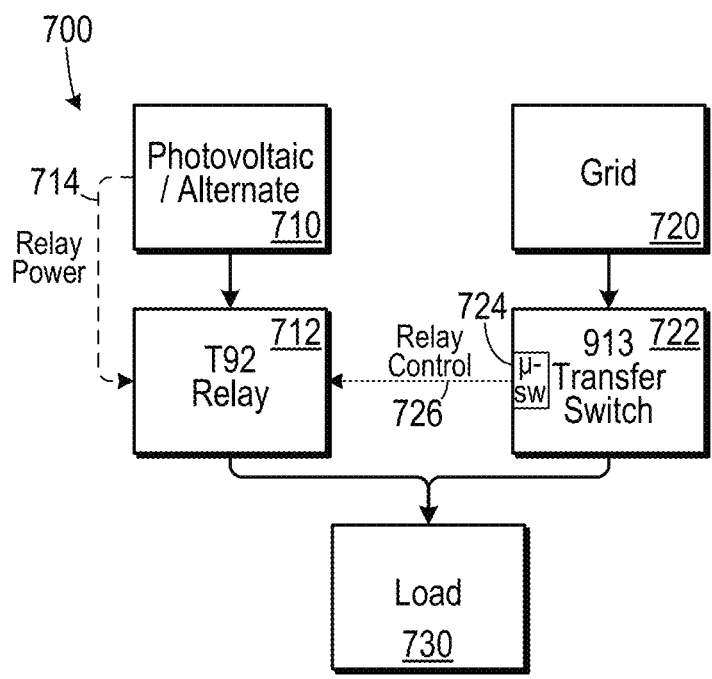
FIG. 10 is a block diagram of a switch-based disconnect circuit embodiment.

In one embodiment, as shown in FIG. 10, a mechanism 700 that works in place of the circuit breakers employs a relay 712 (such as a T92 relay rated at 30 to 50 amps) that selectively couples the alternate source 710 to the load 730. The relay 712 receives state control power from a relay power line 714. The utility grid power source 720 is selectively couplable to the load 730 through a transfer switch (such as a 913 transfer switch, as shown in FIG. 10B) that includes at least one state-indicating microswitch 724 (a typical the transfer switch will have two microswitches). The microswitch 724 indicates whether the transfer switch 722 is in an open state or a closed state. A relay control line 726 causes the relay 712 to couple the alternate source 710 to be coupled to the load 730 only when the microswitch 724 indicates that the transfer switch 722 is in the open state, which indicates that the utility grid power source 720 is decoupled from the load. This embodiment may be preferable for homes having a photovoltaic alternate power source with a battery backup option.

Figure 11:
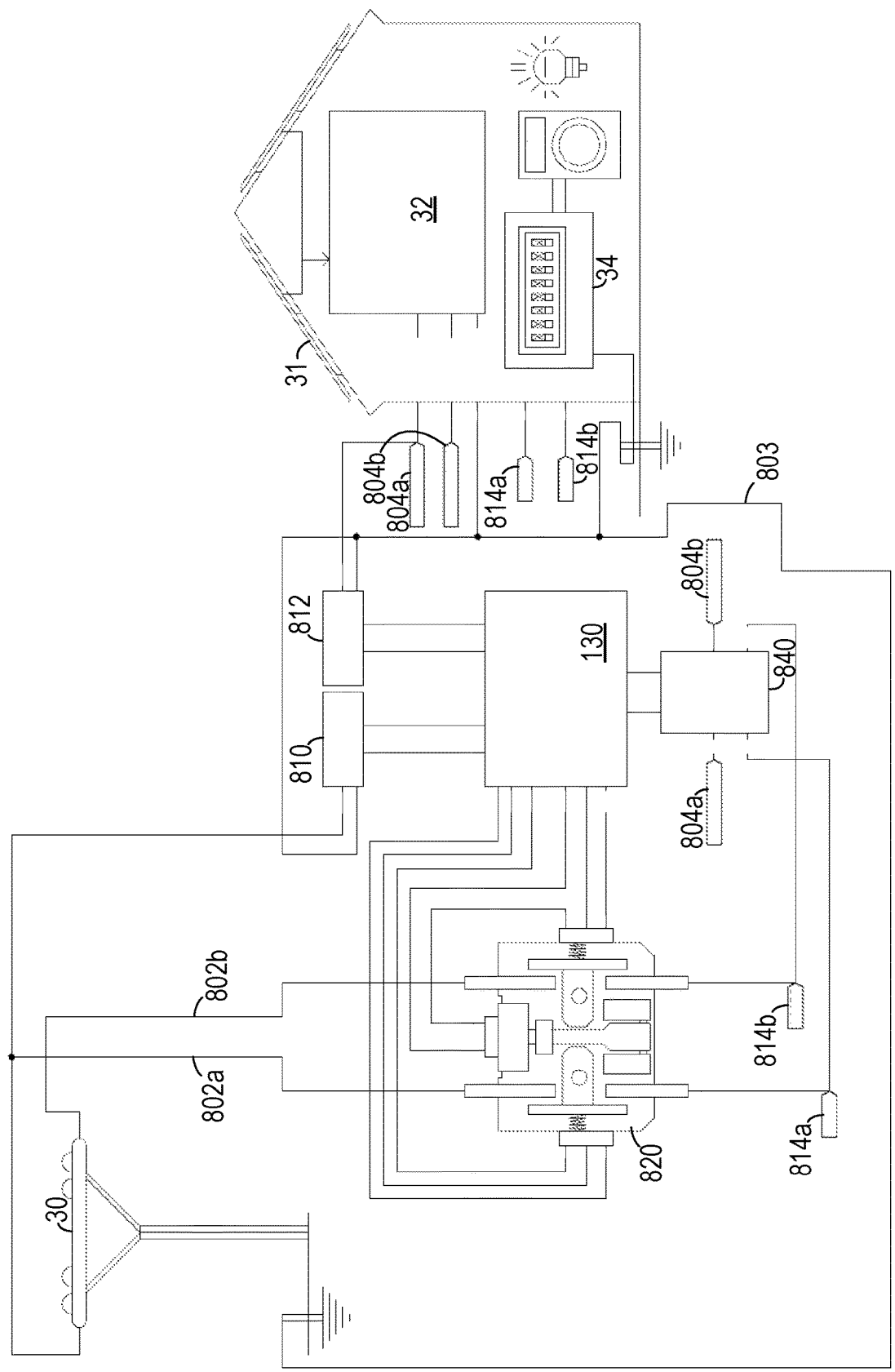
FIG. 11 is a schematic diagram of one commercial embodiment employed with a photovoltaic system.

As shown in FIG. 11, one commercial embodiment can be used in a system in which the grid power source 30 includes a first grid power line 802a and a second grid power line 802b that is 180° out of phase with the first grid power line 802a, both of which have a voltage relative to a common ground line 803. The inverter 32, which receives power from an alternate power source 31 (e.g., a solar power unit, a wind power unit, a hydroelectric power unit, a generator, etc.), delivers power on a first inverter power line 804a and a second inverter power line 804b that is 180° out of phase with the first power line 804a, both of which are in phase with the power from the grid power source 30. The microcontroller 830 is powered by a grid power supply 810 and an inverter power supply 812. The microcontroller 830 controls a two-line relay 820, which selectively couples the first grid power line 802a to a first sub-node 814a and second grid power line 802b to a second sub-node 814b. The inverter relay 840 selectively couples the first inverter power line 804a to a first sub-node 814a and second inverter power line 804b to a second sub-node 814b.

Figure 12A:
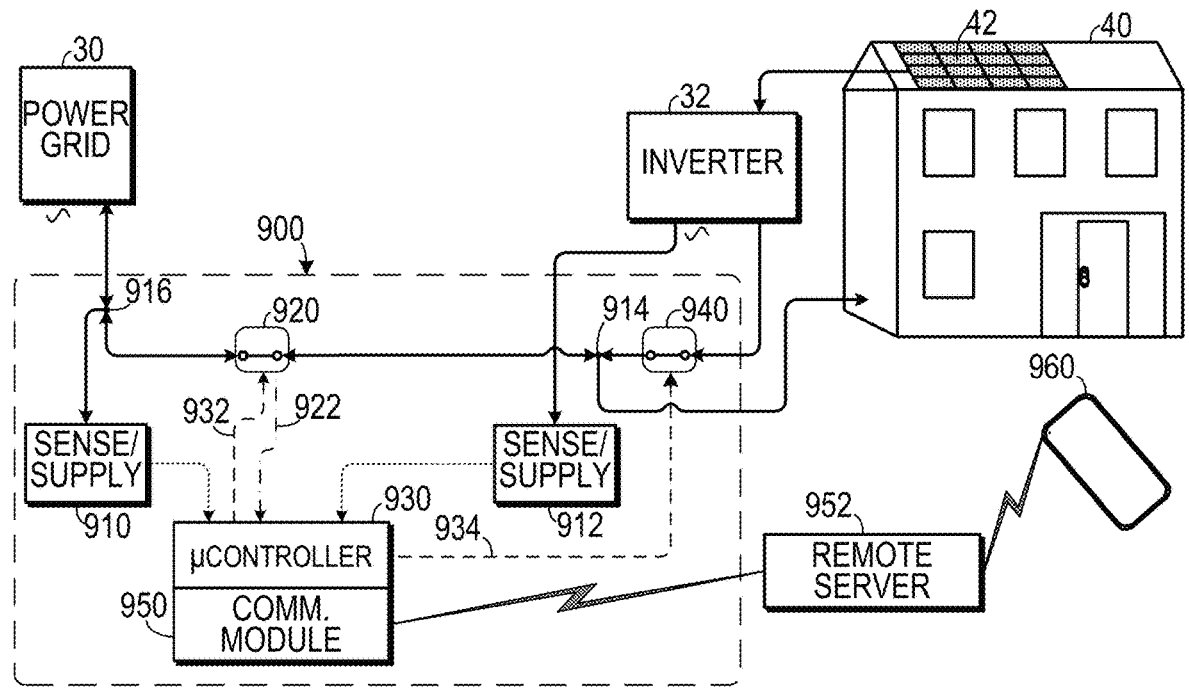
FIGS. 12A-12C are schematic diagrams of one embodiment of a switching apparatus demonstrating three modes of operation.

As shown in FIG. 12A, one embodiment of an apparatus 900 for switching a load 40 (such as a breaker box busbar in a house or office) between a grid power source 30 and an alternative power source 42 (such as a photovoltaic system, a wind power system, a hydroelectric power system, a thermoelectric power system, a generator, etc.) employs an inverter 32 to transform direct current power into alternating current power that is in matched in phase with power from the grid power source 30. The apparatus 900 employs a grid relay 920 that selectively couples the grid power source 30, via a second node 916, to a first node 914. An inverter relay 940 (which could be one of many commonly-known controllable power relays rated to handle the expected current that would flow therethrough) selectively couples the inverter 32 to the first node 914. The first node 914 is coupled to the load 40 and, under normal operating conditions (as shown in FIG. 12A), the grid relay 920 and the inverter relay 940 will remain in a closed state so that power from both the power grid 30 and the inverter 32 can feed the load 40 and so that excess power from the inverter 32 can be fed to the power grid 30.

The grid relay 920 and the inverter relay 914 are both controlled by a microcontroller 930 (such as, in one representative embodiment, an MSP430-series microcontroller available from Texas Instruments), which receives power from both the grid power supply 910 (fed by the grid power source 30) and an inverter power supply 912 (fed by the inverter 32). Thus, if one of the grid power source 30 or the inverter 32 fails, the microcontroller 930 will still have power from the other. A communication module 950 (which can include, for example, a cellular chipset, a local area network chipset coupled to a global computer network, a Wi-Fi-coupled chipset in communication with a global computer network, etc.) can receive system status information from the microcontroller 930 and transmit it to a remote server 952, which can relay the status information to a remote device 960 (such as a cell phone, a tablet, a local computer, etc.). It can also receive system control commands from the remote device 960 via the remote server 952.

Figure 12B:
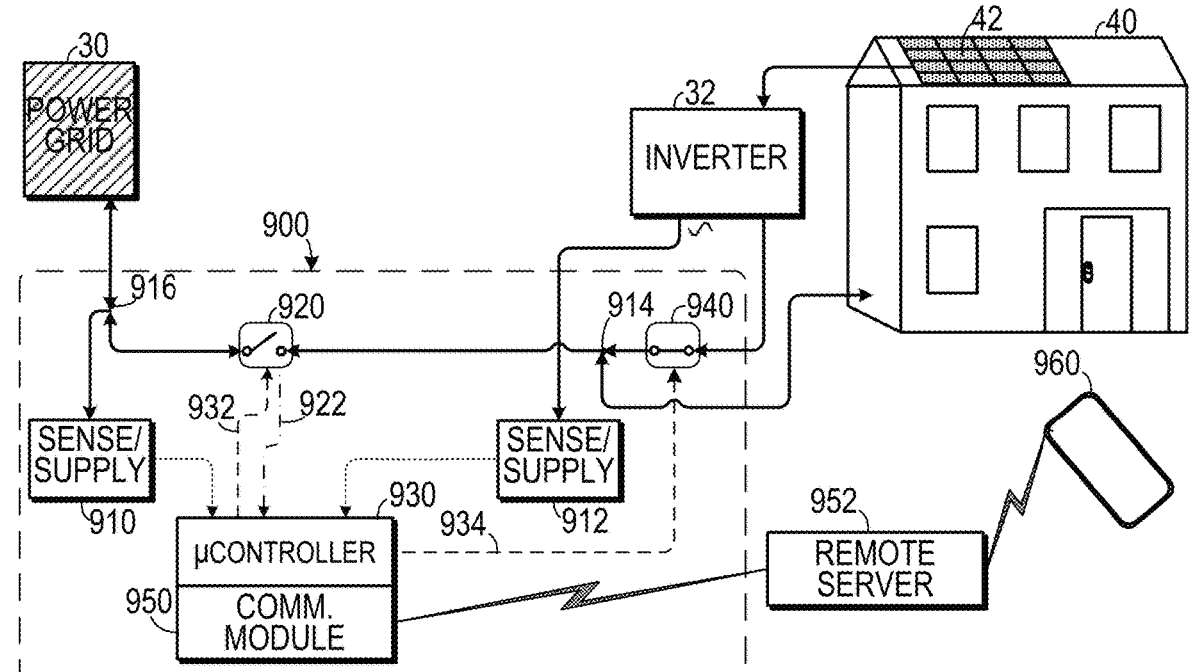

If, as shown in FIG. 12B, the voltage from the grid power supply 910 falls below a predetermined threshold (indicating grid power failure), then the microcontroller 930 will assert an open signal on a grid relay line 932, thereby causing the grid relay 920 to open, thereby decoupling the power grid 30 from the first node 914. Feedback 922 from the grid relay 920 indicates if the grid relay 920 is in an open state and, if so, then the inverter relay 940 remains closed and power from the inverter 32 is fed to the load 40. Thus, the alternate power source 42 can still be used to meet the power requirements of the load 40 in the event of a grid power failure. Because the grid relay 920 decouples the first node from the grid power source 30 in this situation, no power from the inverter 32 is fed back to the power grid 30.

Figure 12C:
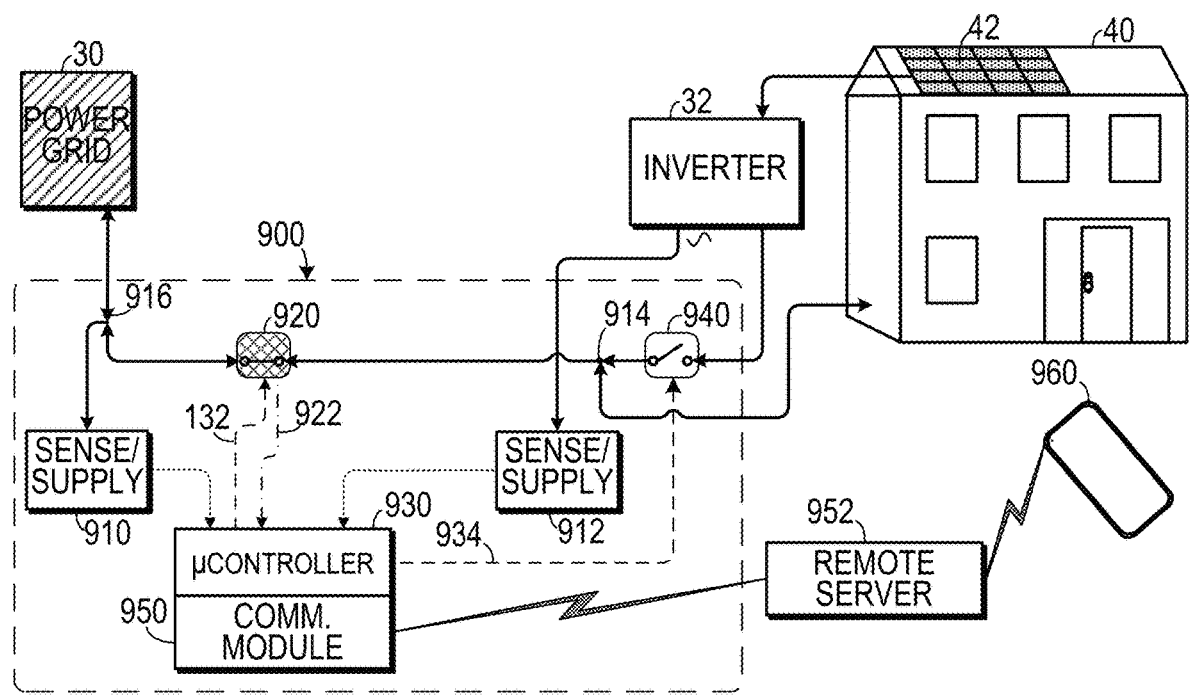

As shown in FIG. 12C, if feedback 922 from the grid relay 920 indicates that the grid relay 920 failed to open properly (indicating a failure of the grid relay 920) while at the same time power from the grid power supply 910 is below the threshold, then the microcontroller 930 will assert an open signal 934 causing the inverter relay 940 to open, thereby isolating the inverter 32 from the first node 914 so that inverter power is not fed onto either the power grid 30 or the load 40.

Figure 13A:
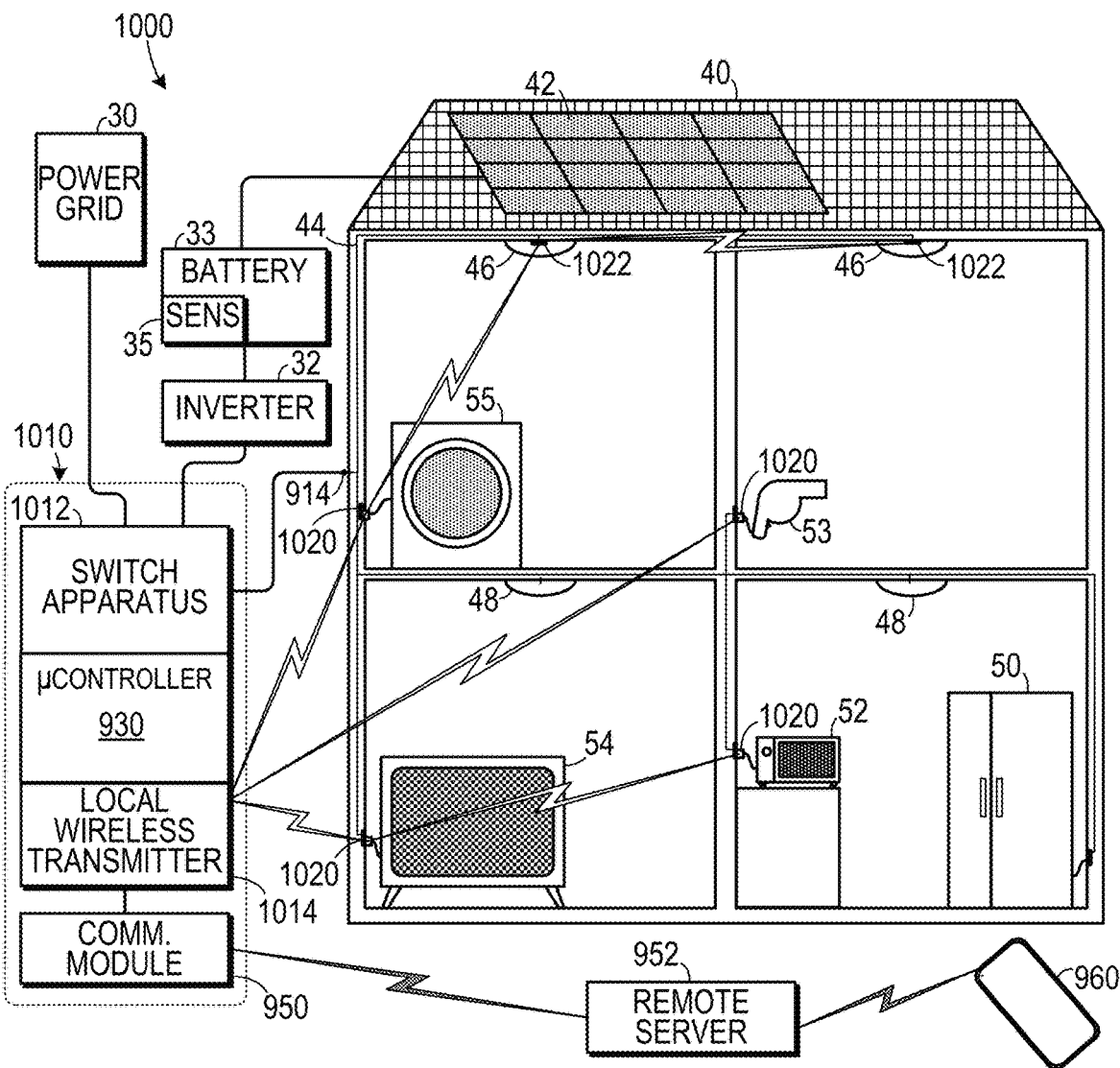
FIG. 13A is a schematic diagram one embodiment of a switching apparatus that includes an automatic system for de-powering of nonessential loads.

As shown in FIG. 13A, one embodiment of the invention can include a power management transfer switch system 1010 for controlling interaction between a multi-source power delivery system 1000 and a load 44. For example, it can be used for switching off non-essential loads during a grid power outage. Each load connected to the electrical distribution system load 44 will be classified as either essential or non-essential. (The power management transfer switch system 1010 can include all of the electronic elements in the apparatus 900 shown in FIGS. 12A-12C.) Examples of essential loads could include, for example, a refrigerator 50 and main floor lights 48 (in certain embodiments, things like medical equipment and emergency devices could also be classified as essential loads). Examples of non-essential loads could include such things as, for example, non-main lighting 46, television sets 54, microwave ovens 52, hair dryers 53 and washing machines 55. Hardwired non-essential loads will be hardwired to a wireless signal-responsive switch 1022 and plug-in non-essential loads may be plugged in to a repositionable wireless signal-responsive switch 1020. The transfer switch system 1010 includes a processor or controller 930 that is integrated with the switch apparatus 1012 (and which can actually be functionality added to microcontroller 930 in FIG. 13A). The microcontroller 930 controls a wireless transmitter 1014, which is configured to send out a wireless disconnect signal when a grid power failure is detected. Upon receiving the disconnect signal, the wireless signal-responsive switches 1020 and 1022 will disconnect the non-essential loads from the power distribution system 44. In one embodiment, the transfer switch system 1010 can also be configured to send a wireless signal to the signal-responsive switches 1020 and 1022, causing them to reconnect the non-essential loads to the power distribution system 44 when the controller 930 detects that grid power has been restored.

The power management transfer switch system 1010 can also include a wireless communications module 950 that can be used to transmit status information to a remote server 952 and to receive control commands from the server 952. The communications module 950 can include a cellular chipset, a local area network chipset, a Wi-Fi chipset, etc., depending upon which type of remote communication is chosen for a specific embodiment. The communications module 950 can include a receiver that receives a signal from the remote server 952 and that transmits a command to the controller 930 representative of the signal. For example, a user of a remote device 960 (which can include a cellular telephone, for example) can switch the power source powering the load 44 from the power grid 30 to the alternate power source 42 upon receiving a notification that the power grid 30 is down by entering a command on an app running on the remote device 62. The remote server 952 receives the command, e.g., via the cloud, and transmits it to the communication module 950. The communication module 950 communicates the command to the control circuit 930, which causes the switch apparatus 1012 to decouple the power grid 30 from the first node 914 and couple the inverter 32 to the first node 914.

The communications circuit 950 receives information regarding the current state of the controller 930 (indicating current states of the grid sensor and the controller and wirelessly communicates any changes of state to the remote device 952. The remote device 952 can be a central server, such as a cloud-based server, that can be accessed by a app running on a portable personal device 960 such as a smart phone, a tablet, laptop, etc.

Changes of state communicable to the remote device 952 can include, for example: an indication of a grid power 30 outage; an indication that the grid power source 30 has been decoupled from the first node 914; an indication that the alternate power source 42 has been coupled to the first node 914; an indication that the alternate power source 42 has been decoupled from the first node 914 and that the grid power source 30 has been coupled to the first node 914; and an indication that a power surge event has taken place. A power storage unit, such as a battery 33, with in integrated remaining capacity sensor 35 can be provided to store power from the alternate power source 42 and one of the changes of state communicable to the remote device 952 can include an indication that the alternate power source 42 or the storage unit battery 33, will be exhausted within a predetermined amount of time.

Figure 13B:
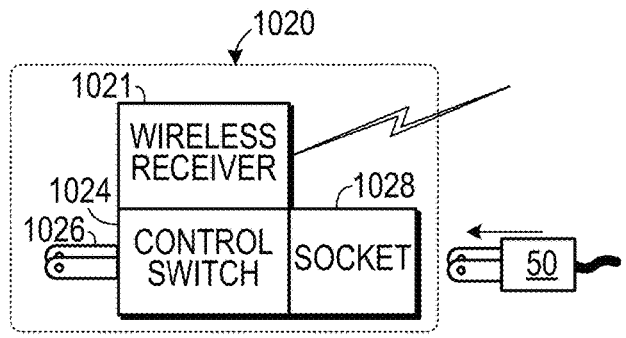
FIG. 13B is a schematic diagram of a decoupling device that intervenes between a wall socket and a nonessential load.

The repositionable wireless signal-responsive switches 1020, as shown in FIG. 13B, can include a wireless receiver 1021 that controls a switch 1024 that is electrically coupled to a switch plug 1026 and a socket 1028. The plug 50 for a non-essential load plugs into the socket 1028 and plug 1026 plugs into a normal socket connected to the power distribution system 44. When a disconnect signal is received by the wireless receiver 1021, the control switch 1024 causes plug 1026 to be disconnected from socket 1028 so as to disconnect plug 50 from the power distribution system 44.

Figure 13C:
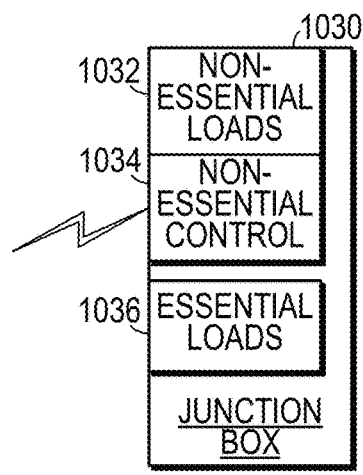
FIG. 13C is a schematic diagram of a junction box that can decouple wiring runs to nonessential loads from a power distribution system.

While hardwired wireless signal-responsive switches 1022 are shown in FIG. 13A, in one alternate embodiment, as shown in FIG. 13C, a central junction box 1030 connected to the power distribution system 44 can include both essential load breakers 1036 and non-essential load breakers 1034 that are controlled by non-essential load controllers 1034, which are responsive to the wireless signals from the wireless transmitter 1014.

This embodiment of the invention offers the advantage of reducing the power consumed from alternate power sources (or storage batteries) during grid power failures, thereby ensuring that the alternate power source provides adequate power for essential loads and that the power available from storage batteries is extended.

Figure 14:
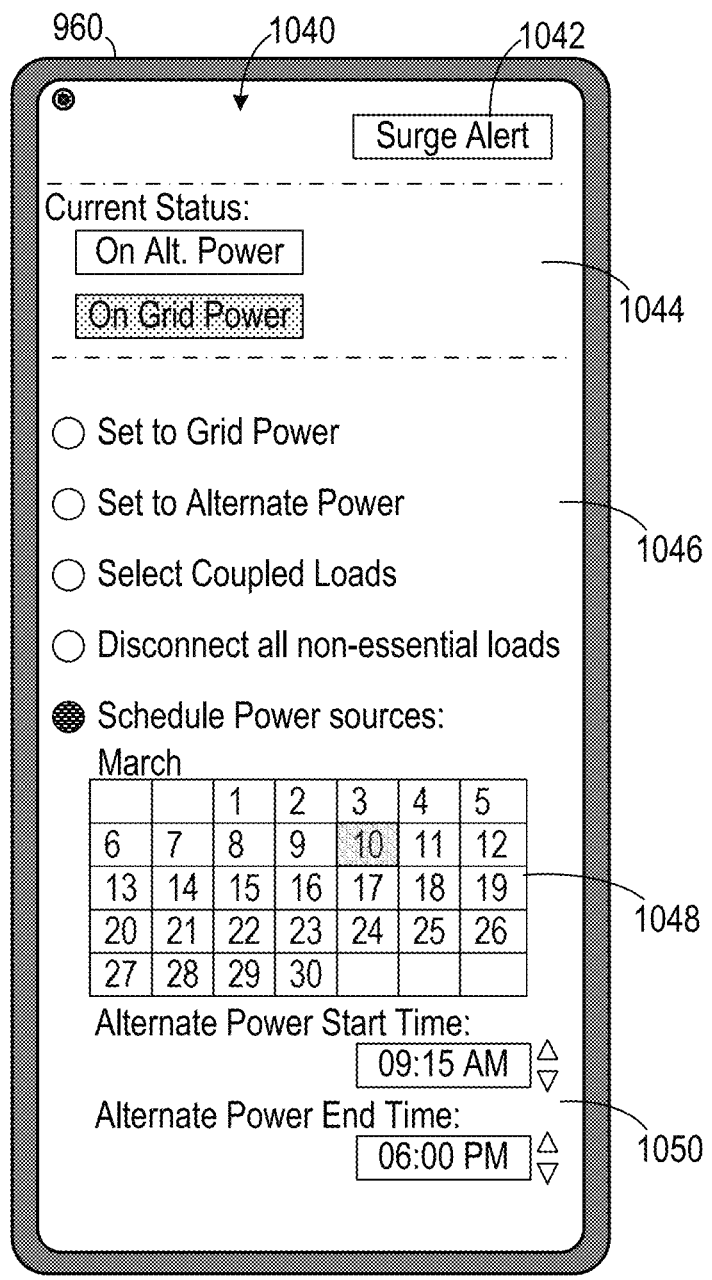
FIG. 14 is a schematic diagram of a smart phone running an app that provides status information and control input remotely for a power distribution system.

As shown in FIG. 14, in one embodiment, the personal device 960 can run an app 1040 that allows the user to receive status information about the power delivery system (item 1000 in FIG. 13A) and generate control commands. For example, the app 1040 can include an alarm 1042 that indicates that the power delivery system has experienced a surge, a current power source indicator 1044 that indicates which power source is currently active, and a command portion 1046. The command portion 1046 can be used to specify which power source is to be coupled to the load and to select specific loads to be connected or disconnected. It can also include a calendar 1048 and time entry 1050 field that allows a user to schedule when each power source is to be coupled to the load.

The personal device 960 is programmed to send user commands to the controller 930 via the central server 952. In an alternate embodiment, the user can communicate commands and receive status information via text messages. The user commands can include timing commands by which the controller switches states of the grid relay and the inverter relay according to a user defined schedule. The user can also command the controller to decouple the grid power source from the first node and to couple the alternate power source to the first node. The remote device 960 can also be programmed to cause automatic decoupling of non-essential loads to the controller upon receiving an indication that the alternate power supply has been coupled to the first node.

Although specific advantages have been enumerated above, various embodiments may include some, none, or all of the enumerated advantages. Other technical advantages may become readily apparent to one of ordinary skill in the art after review of the following figures and description. It is understood that, although exemplary embodiments are illustrated in the figures and described below, the principles of the present disclosure may be implemented using any number of techniques, whether currently known or not. Modifications, additions, or omissions may be made to the systems, apparatuses, and methods described herein without departing from the scope of the invention. The components of the systems and apparatuses may be integrated or separated. The operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set. It is intended that the claims and claim elements recited below do not invoke 35 U.S.C. § 112(f) unless the words "means for" or "step for" are explicitly used in the particular claim. The above-described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An apparatus for selectively coupling a load to a grid power source and an inverter that is fed electric power by an alternate power source, comprising:
   (a) a first node, configured to be coupled to the load;
   (b) a grid sensor that senses a state of the grid power source;
   (c) a grid relay that couples the grid power source to the first node when in a closed state and that decouples the grid power source from the first node when in an open state;
   (d) an inverter relay that couples the inverter to the first node when in a closed state and that decouples the inverter from the first node when in an open state;
   (e) a controller that is responsive to the grid sensor and that is programmed to:
      (i) cause the grid relay to be in the closed state and cause the inverter relay to be in the closed state when the grid sensor indicates power is available from the grid;
      (ii) cause the grid relay to be in the open state when the grid sensor indicates that power is not available from the grid; and
      (iii) cause the inverter relay to be in the open state when the grid sensor indicates power is not available from the grid and when feedback from the grid relay indicates that the grid relay is in the closed state; and
   (f) a communications circuit that senses a current state of the controller and that wirelessly communicates a change of state of a selected one of the grid sensor and the controller to a remote device.

2. The apparatus of claim 1, wherein the change of state comprises a grid power outage.

3. The apparatus of claim 1, wherein the change of state comprises an indication that the grid power source has been decoupled from the first node.

4. The apparatus of claim 3, wherein the change of state further comprises an indication that the alternate power source has been coupled to the first node.

5. The apparatus of claim 1, wherein the change of state comprises an indication that the alternate power source has been decoupled from the first node and that the grid power source has been coupled to the first node.

6. The apparatus of claim 1, further comprising an alternate power source sensor that senses a state of the alternate power source and wherein the change of state comprises an indication that the alternate power source will be exhausted within a predetermined amount of time.

7. The apparatus of claim 1, wherein the change of state comprises an indication that a surge event has taken place.

8. The apparatus of claim 1, wherein the remote device comprises a central server.

9. The apparatus of claim 8, wherein the central server is configured to communicate with a personal device.

10. The apparatus of claim 9, wherein the personal device is programmed to send user commands to the controller via the central server.

11. The apparatus of claim 10, wherein the user commands include timing commands by which the controller switches states of the grid relay and the inverter relay according to a user defined schedule.

12. The apparatus of claim 9, wherein the personal device communicates with the central server via an app.

13. The apparatus of claim 9, wherein the personal device communicates with the central server via a text message.

14. The apparatus of claim 1, wherein the communications circuit further comprises a receiver that receives a signal from the remote device and that transmits a command to the controller representative of the signal.

15. The apparatus of claim 14, wherein the command causes the controller to decouple the grid power source from the first node and to couple the alternate power source to the first node.

16. The apparatus of claim 14, wherein the command causes the controller to selectively couple selected loads to the first node and decouple selected loads from the first node.

17. The apparatus of claim 16, further comprising a plurality of load couplers that selectively couple and decouple the selected loads to the first node, each of the plurality of load couplers including a wireless receiver that receives load coupling and decoupling commands from the controller and a switch that is responsive to the wireless receiver.

18. The apparatus of claim 16, wherein the selected loads comprise loads designated as non-essential loads.

19. The apparatus of claim 14, wherein the remote device is programmable so as to cause a signal commanding decoupling of non-essential loads to the controller upon receiving an indication that the alternate power supply has been coupled to the first node.

\* \* \* \* \*